United States Patent
Doyle et al.

(10) Patent No.: US 10,878,871 B2
(45) Date of Patent: Dec. 29, 2020

(54) SPIN TRANSFER TORQUE MEMORY (STTM) DEVICES WITH DECREASED CRITICAL CURRENT AND COMPUTING DEVICE COMPRISING THE SAME

(71) Applicant: Intel Corporation, Santa Clara, CA (US)

(72) Inventors: Brian S. Doyle, Portland, OR (US); Prashant Majhi, San Jose, CA (US); Kaan Oguz, Beaverton, OR (US); Kevin P. O'Brien, Portland, OR (US); Abhishek A. Sharma, Hillsboro, OR (US); David L. Kencke, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/629,466

(22) PCT Filed: Sep. 28, 2017

(86) PCT No.: PCT/US2017/054195
§ 371 (c)(1),
(2) Date: Jan. 8, 2020

(87) PCT Pub. No.: WO2019/066881
PCT Pub. Date: Apr. 4, 2019

(65) Prior Publication Data
US 2020/0357449 A1    Nov. 12, 2020

(51) Int. Cl.
*G11C 11/16* (2006.01)
*H01L 45/00* (2006.01)
(Continued)

(52) U.S. Cl.
CPC ........ *G11C 11/161* (2013.01); *G11C 11/1659* (2013.01); *G11C 11/1675* (2013.01);
(Continued)

(58) Field of Classification Search
None
See application file for complete search history.

(56) References Cited

U.S. PATENT DOCUMENTS

2006/0056114 A1* 3/2006 Fukumoto ............... H01L 43/08
                                                          360/324.2
2013/0099780 A1   4/2013 Ma et al.
(Continued)

FOREIGN PATENT DOCUMENTS

WO    WO-2017052631    3/2017

OTHER PUBLICATIONS

International Search Report and Written Opinion for International Patent Application No. PCT/US2017/054195 dated Feb. 22, 2018, 13 pgs.
(Continued)

*Primary Examiner* — Tan T. Nguyen
(74) *Attorney, Agent, or Firm* — Schwabe, Williamson & Wyatt, P.C.

(57) ABSTRACT

Spin transfer torque memory (STTM) devices incorporating an Insulator-Metal-Transition (IMT) device or at least one layer of Insulator-Metal-Transition (IMT) material are disclosed. The Insulator-Metal-Transition (IMT) device or at least one layer of Insulator-Metal-Transition (IMT) material are utilized for providing a spike current when the voltage across it exceeds the threshold voltage to reduce a critical current required for transfer torque induced magnetization switching.

22 Claims, 9 Drawing Sheets

(51) Int. Cl.
*H01L 43/02* (2006.01)
*H01L 43/10* (2006.01)
*H01L 43/08* (2006.01)

(52) U.S. Cl.
CPC .......... *G11C 11/1697* (2013.01); *H01L 43/02* (2013.01); *H01L 43/08* (2013.01); *H01L 43/10* (2013.01); *H01L 45/1233* (2013.01); *H01L 45/1253* (2013.01); *H01L 45/146* (2013.01)

(56) References Cited

U.S. PATENT DOCUMENTS

| | | | |
|---|---|---|---|
| 2015/0021726 A1* | 1/2015 | Min | H01L 43/08 257/421 |
| 2015/0333252 A1 | 11/2015 | Doyle et al. | |
| 2016/0093802 A1 | 3/2016 | Hou et al. | |
| 2016/0196860 A1 | 7/2016 | Buhrman et al. | |

OTHER PUBLICATIONS

International Preliminary Report on Patentability for International Patent Application No. PCT/US17/54195, dated Apr. 9, 2020, 10 pgs.

* cited by examiner

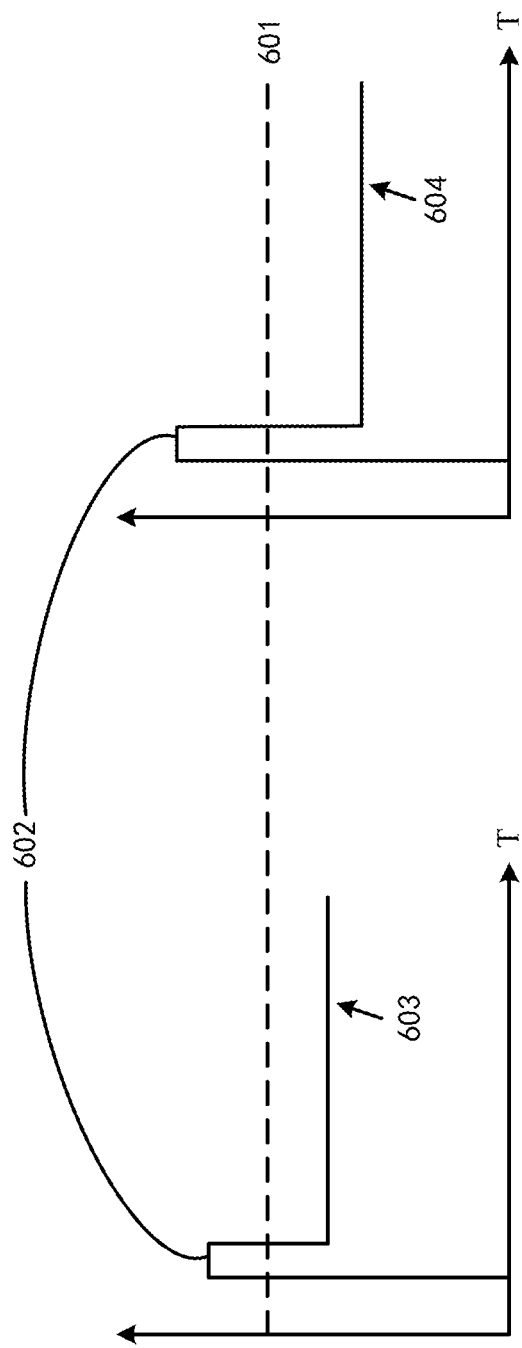

SPIN TRANSFER TORQUE MEMORY (STTM) DEVICES WITH DECREASED CRITICAL CURRENT AND COMPUTING DEVICE COMPRISING THE SAME

CROSS-REFERENCE TO RELATED APPLICATION

This patent application is a U.S. National Phase Application under 35 U.S.C. § 371 of International Application No. PCT/US2017/054195, filed Sep. 28, 2017, entitled "SPIN TRANSFER TORQUE MEMORY (STTM) DEVICES WITH DECREASED CRITICAL CURRENT AND COMPUTING DEVICE COMPRISING THE SAME," which designates the United States of America, the entire disclosure of which is hereby incorporated by reference in its entirety and for all purposes.

TECHNICAL FIELD

Embodiments of the invention are in the field of memory devices and, in particular, spin transfer torque memory (STTM) devices.

BACKGROUND

STTM devices are non-volatile memory devices that utilize a phenomenon known as tunneling magnetoresistance (TMR). For an MTJ (magnetic tunnel junction) structure including two ferromagnetic layers separated by a thin insulating tunnel layer, it is more likely that electrons will tunnel through the tunnel layer when magnetizations of the two magnetic layers are in a parallel orientation than if they are not (non-parallel or antiparallel orientation). As such, an MTJ can be switched between two states of electrical resistance, one state having a low resistance and one state with a high resistance.

For an STTM device, current-induced magnetization switching is used to set the bit states. Polarization states of one ferromagnetic layer (known as "the free magnetic layer") are switched relative to a fixed polarization of the second ferromagnetic layer (known as "the fixed magnetic layer") via the spin transfer torque phenomenon, enabling states of the MTJ to be set by application of current. Upon passing a current through the fixed magnetic layer, angular momentum (spin) of the electrons is polarized along the direction of the magnetization of the fixed magnetic layer. These spin polarized electrons transfer their spin angular momentum to the magnetization of the free magnetic layer and cause it to precess. As such, the magnetization of the free magnetic layer can be switched by a pulse of current (e.g., in about 1 nano-second) exceeding a certain critical value with magnetization of the fixed magnetic layer remaining unchanged as long as the current pulse is below a higher threshold attributable to a different geometry, an adjacent pinning layer, different coercivity (Hc), etc.

The critical value of current required for switching magnetization of the free magnetic layer, referred to herein as the "critical current," is a factor impacting the dimensions of a transistor coupled to the STTM device since the transistor can only output a finite amount of current. Larger critical current requires larger transistor, resulting in a larger footprint for a 1T-1R STTM bit cell size, higher power consumption, etc. For STTM array capacity and power consumption to be competitive with other memory technologies, such as DRAM, a reduction in critical current is advantageous.

BRIEF DESCRIPTION OF THE DRAWINGS

Embodiments of the present invention are illustrated by way of example, and not limitation, in the figures of the accompanying drawings in which:

FIG. 6A illustrates a schematic view of the relationship between the critical current to switch a bit cell of an STTM device and the spike current density, in accordance with an embodiment in which no additional capacitor is incorporated into the bit cell;

FIG. 6B illustrates a schematic view of the relationship between the critical current to switch a bit cell of an STTM device and the spike current density, in accordance with an embodiment in which an additional capacitor is incorporated into the bit cell;

DETAILED DESCRIPTION

Described herein are spin transfer torque memory (STTM) devices incorporating an Insulator-Metal-Transition (IMT) device or at least one layer of Insulator-Metal-Transition (IMT) material. The Insulator-Metal-Transition (IMT) device or at least one layer of Insulator-Metal-Transition (IMT) material are utilized for providing a momentary spike of current when the voltage across it exceeds the threshold voltage so as to reduce a critical current required for transfer torque induced magnetization switching. In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "in an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other.

The terms "over," "under," "between," and "on" as used herein refer to a relative position of one material layer or component with respect to other layers or components. For example, one layer disposed over (above) or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

Figure 1:
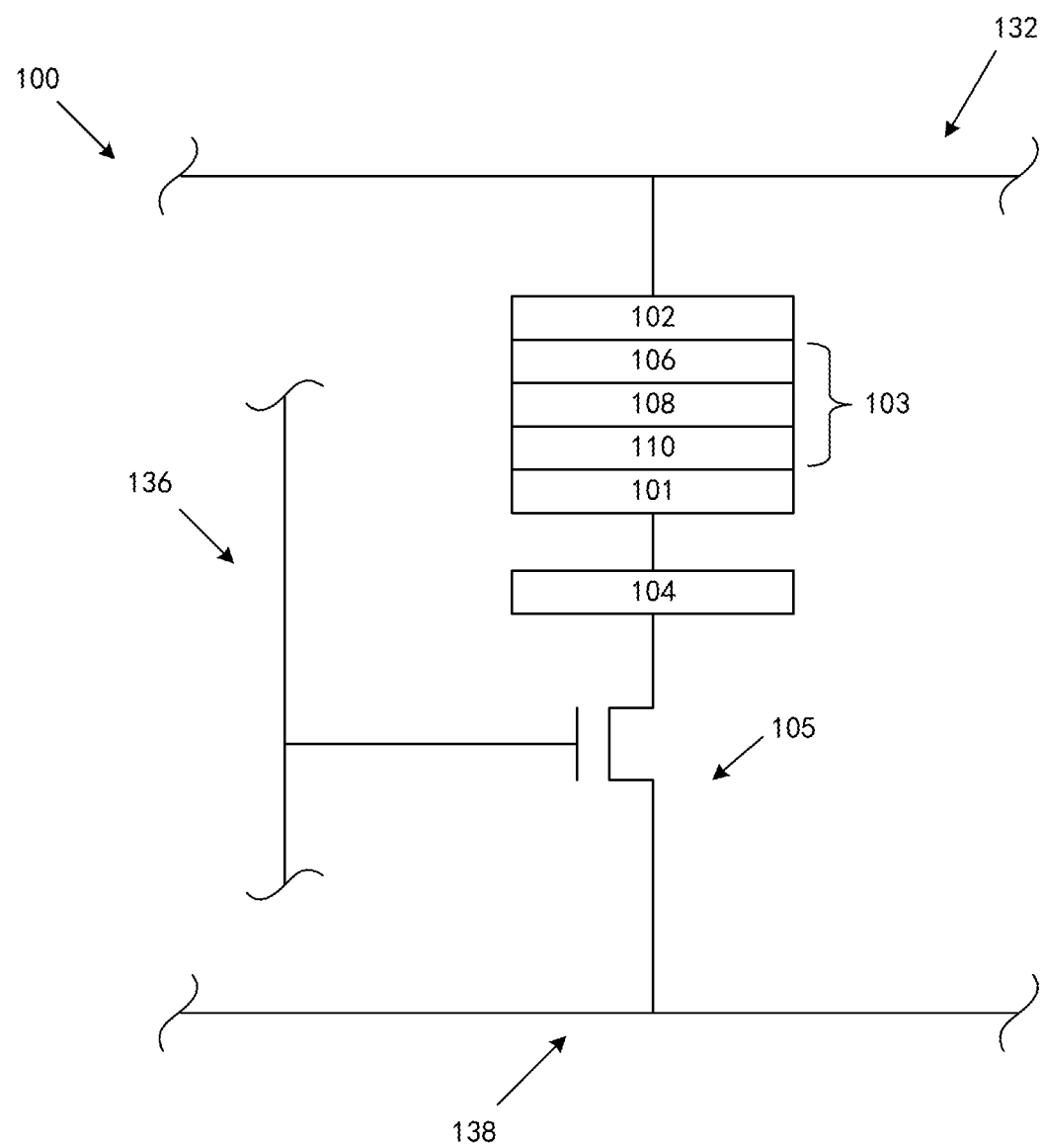
FIG. 1 illustrates a schematic view of a bit cell of an STTM device comprising an Insulator-Metal-Transition (IMT) device, in accordance with an embodiment of the present invention.

FIG. 1 illustrates a schematic view of a bit cell 100 of an STTM device comprising an Insulator-Metal-Transition (IMT) device 104, in accordance with an embodiment of the present invention. Generally, the STTM device is a device suitable for magnetic storage (i.e., a spintronic memory element) and is illustrated in an advantageous vertical stack orientation although other orientations (horizontal, etc.) are also possible. Generally, the bit cell 100 of STTM device includes an MTJ stack 103 disposed between fixed magnetic layer electrode 101 and free magnetic layer electrode 102, respectively. Notably, embodiments herein illustrate structures and techniques to enhance a STTM device through application of a spike current that are broadly applicable to any MTJ stack known in the art applicable for an STTM device. As such, while exemplary embodiments include a description of one advantageous MTJ stack 103 for the sake of clarity, embodiments of the invention are not limited to any one MTJ stack and instead may be readily adapted to one of the many variations known in the art. In the embodiment, the MTJ stack 103 includes a fixed magnetic layer 110, a tunneling barrier layer 108 disposed over the fixed magnetic layer 110, and a free magnetic layer 106 disposed over the tunneling barrier layer 108. In other embodiments, the order of the functional layers of the MTJ stack 103 is inverted. Furthermore, depending on the embodiment, the MTJ stack 103 may have either an in-plane anisotropic epitaxial structure or an out-of-plane, or "perpendicular," anisotropic epitaxial/textured structure.

Generally, the fixed magnetic layer 110 is composed of a material or stack of materials suitable for maintaining a fixed magnetization direction while the free magnetic layer 106 is composed of a magnetically softer material or stack of materials (i.e. magnetization can easily rotate to parallel and antiparallel state with respect to fixed magnetic layer). The tunneling barrier layer 108 is composed of a material or stack of materials suitable for allowing current of a majority spin to pass through the layer, while impeding current of a minority spin (i.e., a spin filter).

In the exemplary embodiment, the MTJ stack 103 is based on a CoFeB/MgO system, having an MgO tunneling layer 108 and CoFeB layers 106, 110. In certain embodiments, all layers of the MTJ stack 103 have (001) out-of-plane texture, where texture refers to the distribution of crystallographic orientations within the layers of the MTJ structure. For embodiments described herein, a high percentage of crystals of the CoFeB/MgO/CoFeB MTJ stack 103 have the preferred (001) out-of-plane orientation (i.e., the degree of texture is high) for a TMR ratio of at least 100%. In one advantageous CoFeB/MgO embodiment, the (001) oriented CoFeB magnetic layers 106, 108 are iron-rich alloys (i.e., Fe>Co), such as, but not limited to, $Co_{20}Fe_{60}B_{20}$. Other embodiments with equal parts cobalt and iron are also possible (e.g., $Co_{40}Fe_{40}B_{20}$), as are lesser amounts of iron (e.g., $Co_{70}Fe_{10}B_{20}$). In still other embodiments the tunneling layer 108 composition serves as a suitable texture template but is other than MgO, for example aluminum oxide (AlOx).

The tunneling barrier layer 108 may have a thickness up to 2 nm, however resistance for a given device area generally increases exponentially with tunneling layer thickness. In exemplary MgO embodiments, thicknesses below 1 nm provide advantageously low resistance with thickness between 1 nm and 1.3 nm also providing acceptably low resistance. Thickness of the fixed magnetic layer 110 may also vary considerably, for example between 1 nm and 2 nm. In embodiments, the thickness of the free magnetic layer 106 is over 1 nm (e.g., at least 1.1 nm) and exemplary iron-rich CoFeB embodiments of the free magnetic layer 106 have a thickness between 1.3 nm and 2 nm. This greater thickness improves thermal stability of the free magnetic layer 106, enabling longer non-volatile lifetimes of an STTM device relative to a free magnetic layer of lesser thickness.

Although for the exemplary embodiment, the MTJ stack 103 is disposed directly on the electrode 101 (e.g., with CoFeB fixed magnetic layer 110 directly on a Ta layer), it is noted again that an MTJ stack may vary considerably without deviating from the scope of the embodiments of the present invention. For example, one or more intermediate layer may be disposed between the fixed magnetic layer 110 and the electrode 101. For example, an anti-ferromagnetic layer, such as, but not limited to, iridium manganese (IrMn) or platinum manganese (PtMn), or a synthetic antiferromagnetic (SAF) structure including such an anti-ferromagnetic layer, adjacent to another ferromagnetic layer (e.g., CoFe) with a nonmagnetic spacer layer, such as, but not limited to Ru, intervening between the fixed magnetic layer 106 and the SAF, may be present for various purposes, such as pinning an interface of the fixed magnetic layer 110 (e.g., through exchange-bias coupling).

Electrically connected to the MTJ stack 103 are the electrodes 101 and 102. The electrodes 101 and 102 are each of a material or stack of materials operable for electrically contacting magnetic electrodes of a STTM device, and may be any material or stack of materials known in the art for such a purpose. Although the electrodes 101, 102 may have a range of layer thicknesses (e.g., 5 nm-50 nm) and include a variety of materials to form a compatible interface with both the MTJ stack 103 and interconnects, in the exemplary embodiment the fixed magnetic layer electrode (the first electrode) 101 includes at least a tantalum (Ta) layer and may further include an additional underlying conductive buffer including at least one ruthenium (Ru) layer and a second Ta layer. For the free magnetic layer electrode (the second electrode) 102, a metal having high conductivity even if oxidized at the surface is advantageous, such as, but not limited to, Cu, Al, Ru, Au, etc, with Ru advantageously providing a good barrier of oxygen, reducing the possibility of oxidation within the MTJ stack 103.

As illustrated in FIG. 1, a transistor 105 is electrically connected to a source line 138, and a word line 136 in a manner that will be understood to those skilled in the art. Different from the conventional 1T-1R STTM device, the transistor 105 in the embodiment shown in FIG. 1 is series connected with the first electrode 101 via an Insulator-Metal-Transition (IMT) device 104.

The second electrode 102 may be electrically connected to a bit line 132. The bit cell 100 of the STTM device may further include additional read and write circuitry (not shown), a sense amplifier (not shown), a bit line reference (not shown), and the like, as will be understood by those skilled in the art, for the operation of the STTM device. It is to be understood that a plurality of the bit cells may be operably connected to one another to form a memory array (not shown), wherein the memory array can be incorporated into a non-volatile memory device. In another embodiment, the order of the multilayers of the MTJ stack 103 can be inverted, as readily occur to the skilled in the art. In other words, the transistor 105 may be coupled to the second electrode 102 or the first electrode 101 via the IMT device 104, although only the latter is shown.

In the embodiment shown in FIG. 1, the IMT device 104 is electrically connected in series with the MTJ stack 103 and the transistor 105. Herein, the term "IMT device" refers to the type of device that exhibits a high electrical resistance in off-state and will transition from the high resistance state (or off-state) to a low resistance state (or conducting state) when a voltage across it exceeds a threshold voltage thereof. Since its electrical resistance in off-state is high enough to be regarded as an insulator equivalent and its electrical resistance in the conducting state is low enough to be regarded as a metal equivalent, it is called or referred to as "Insulator-Metal-Transition (IMT) device". However, the skilled in the art should understand that any type of IMT device could be utilized in the present invention as long as its electrical resistance ratio between the two states is big enough so that a momentary spike of current can be induced during the state transition period of such kind of device.

In an embodiment of the present invention, the IMT device 104 may be various types and may comprise at least one layer of Insulator-Metal-Transition (IMT) material having such transition characteristic. For example, the Insulator-Metal-Transition (IMT) material may comprise at least one of $TiO_2$, $Si_3N_4$, $VO_2$, multicomponent chalcogenide. $NbO_2$, $TaO_X$, Ag, and Oxide. Those materials show a good IMT characteristic and are preferable for being used as the IMT device in the present invention. However, the skilled in the art may easily understand that, those materials listed above are only for exemplification purpose, other material may also be used as long as the electrical resistance thereof has abrupt change from high to low when the voltage across it exceeds a certain threshold voltage so that a momentary spike of current can be induced during the state transition period of such kind of material.

As mentioned above, the IMT device may be various types. In one embodiment, the IMT device may be a schottky diode and the IMT material for the schottky diode may comprise titanium oxide, preferably, $TiO_2$. In one embodiment, the IMT device may be a tunneling diode and the IMT material for the tunneling diode may comprise silicon nitride, preferably, $Si_3N_4$. In one embodiment, the IMT device may be a varistor and the IMT material for the varistor may comprise a multilayer stack of tantalum oxide and titanium oxide, preferably, a stack of $TaO_X/TiO_2/TaO_X$. In one embodiment, the IMT device may be a compositional IMT device and the IMT material for the compositional IMT device may comprise a multilayer stack of Ag/oxide. In one embodiment, the IMT device may be a Mott IMT device and the IMT material for the Mott IMT device may comprise vanadium oxide, preferably, $VO_2$. In one embodiment, the IMT device may be an Anderson IMT device and the IMT material for the Anderson IMT device may comprise multicomponent Chalcogenide. In one embodiment, the IMT device may be a Peierls IMT device and the IMT material for the Peierls IMT device may comprise niobium oxide, preferably, $NbO_2$.

In the embodiment shown in FIG. 1, the IMT device 104 is electrically connected between the transistor 105 and the MTJ stack 103, and the MTJ stack 103 is electrically connected to a bit line 132. However, the skilled in the art should easily understand that in other embodiment of the present invention, the MTJ stack 103 may be electrically connected between the transistor 105 and the IMT device 104, and the IMT device 104 may be electrically connected to the bit line 132.

Figure 2A:
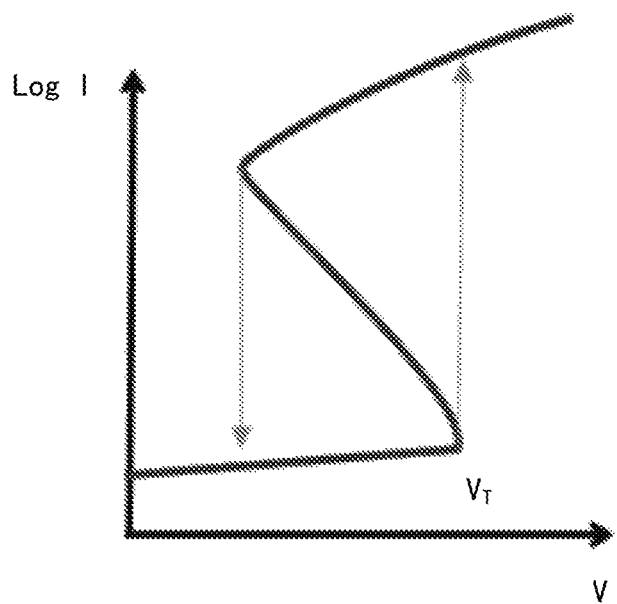
FIG. 2A illustrates the I-V characteristic curve of an IMT device, in accordance with an embodiment of the present invention.

FIG. 2A shows the I-V characteristic curve of the IMT device 104. As can be seen from FIG. 2A, the IMT device 104 stays in the off-state until a certain critical voltage ($V_T$—Threshold Voltage), at which point it immediately goes into the low resistance region (follows the arrows, rather than the middle part of the 'S' curve). If the IMT device 104 is incorporated into the conventional STTM bit cell (1T-1R structure, i.e., one transistor and one MTJ as the resistance element to store the information), when such an abrupt transition occurs for the IMT device 104, a momentary spike of current will be generated in the bit cell 100 due to the re-partitioning of the voltages across the bit cell 100, as the modeling shows in FIG. 2B.

More specifically, the IMT device 104 does not switch to its conducting (metal-like) state until the bit cell 100 reaches a certain voltage potential (for example, 0.99V). For the structure shown in FIG. 1, the voltage in the middle between MTJ stack 103 and IMT device 104 is, for example, 0.95V because the IMT device 104 is acting as an insulator with a much higher electrical resistance than that of the MTJ stack 103, so very little voltage falls across the MTJ stack 103.

When the voltage applied to the bit cell 100 is increased to, for example, 1.01V so that the voltage across the IMT device 104 is above the threshold voltage thereof, the IMT device 104 immediately switches into the conducting state. When this switch happens, the IMT device 104 is like a short circuit, and almost all the voltage falls across the resistance of MTJ stack 103, which in turn means that voltage in the middle between MTJ stack 103 and IMT device 104 is now very small, for example, 0.1V.

Figure 2B:
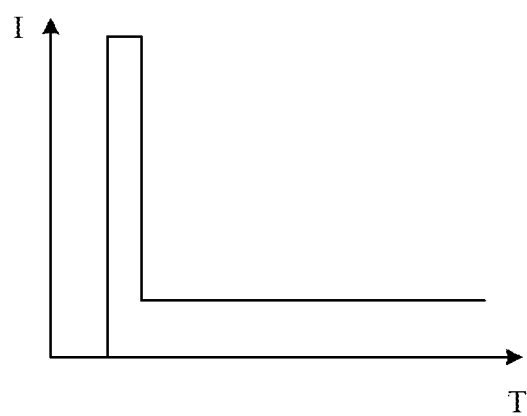
FIG. 2B illustrates a momentary spike of current induced in the bit cell due to the transition of the IMT device, in accordance with an embodiment of the present invention.

During that switch on, the circuit of bit cell 100 has to supply enough charge to redistribute the voltages across the bit cell circuit (to go from 0.95V to 0.1V in the middle between MTJ stack 103 and IMT device 104). During this very short time, the current in the bit cell circuit spikes to accommodate the voltage change. Once equilibrium is reached, only a lower steady-state current flows through the circuit, as shown in the bottom of FIG. 2B at later long times.

Figure 3:
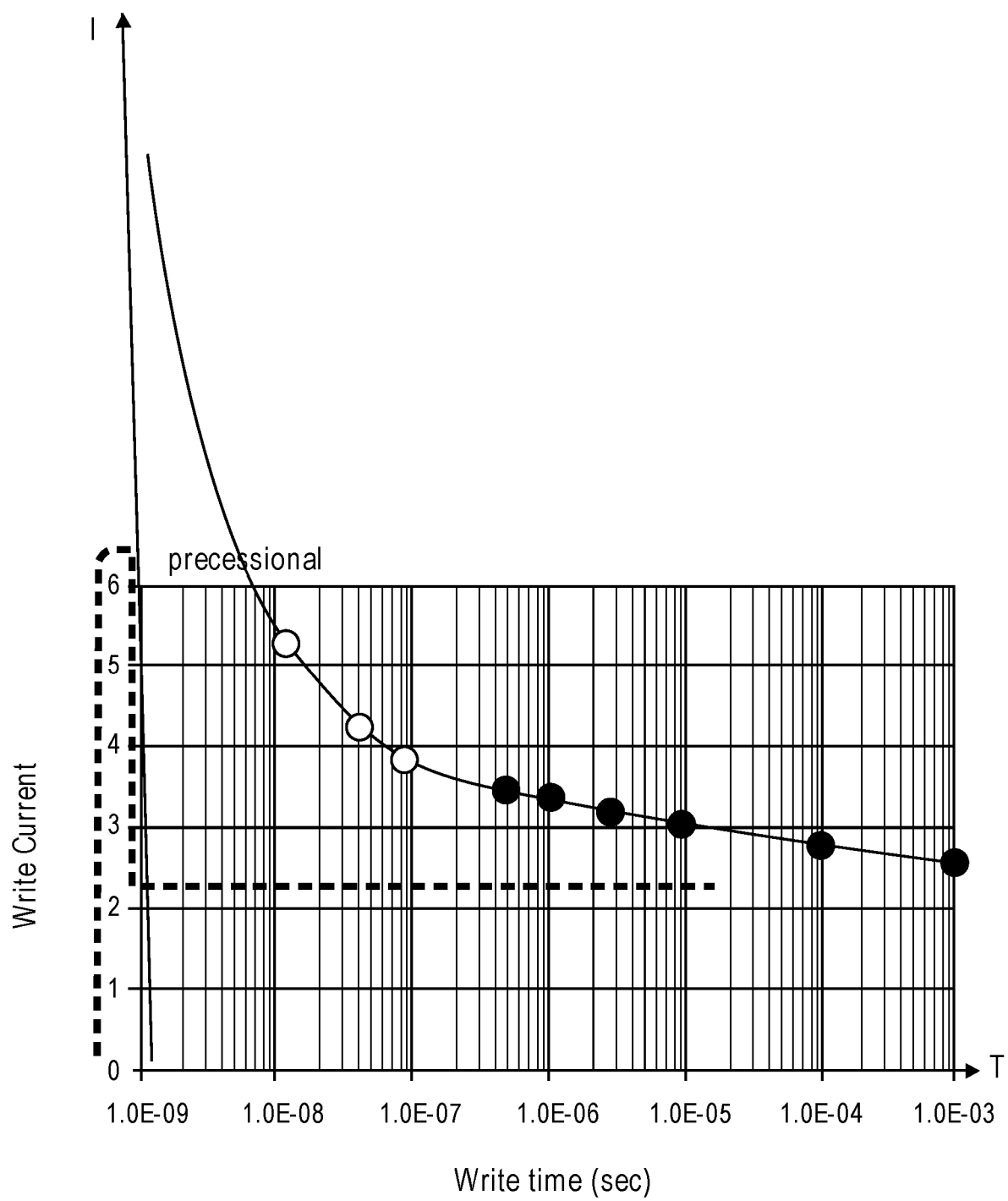
FIG. 3 illustrates the amount of current needed to switch a bit cell of an STTM device (y axis) as a function of write pulse time (x axis)

FIG. 3 shows the amount of write current needed to switch an MTJ as a function of write pulse time. As can be seen from FIG. 3, as the write pulse time decreases, the amount of current needed to switch the MTJ will increase gradually and relatively smoothly from for example time point of 1.0E-03 second to time point of 1.0E-06 second (the section with black solid circles). Whereas, the amount of current needed to switch the MTJ will increase precipitously in what is called the 'precessional' switching regime (the graph section with white hollow circles).

In the present invention, when writing to a bit cell to change its state from a '0' to a '1' or vice-versa, this spike of charge resulting from the turn-on of the IMT device 104 is added to the current that the transistor 105 drives through the bit cell, resulting in a nano-second pulse (i.e., in the magnitude of 1.0E-09 second) at the beginning of the write cycle, which is shown in FIG. 3 as a dotted line.

Although the charge (current*time) is still small compared to the current needed to switch the device in the precessional regime, that current pulse causes the bit cell 100 to be able to be switched at lower critical current levels than are required without the spike of current induced due to the turn-on of the IMT device.

Figure 4:
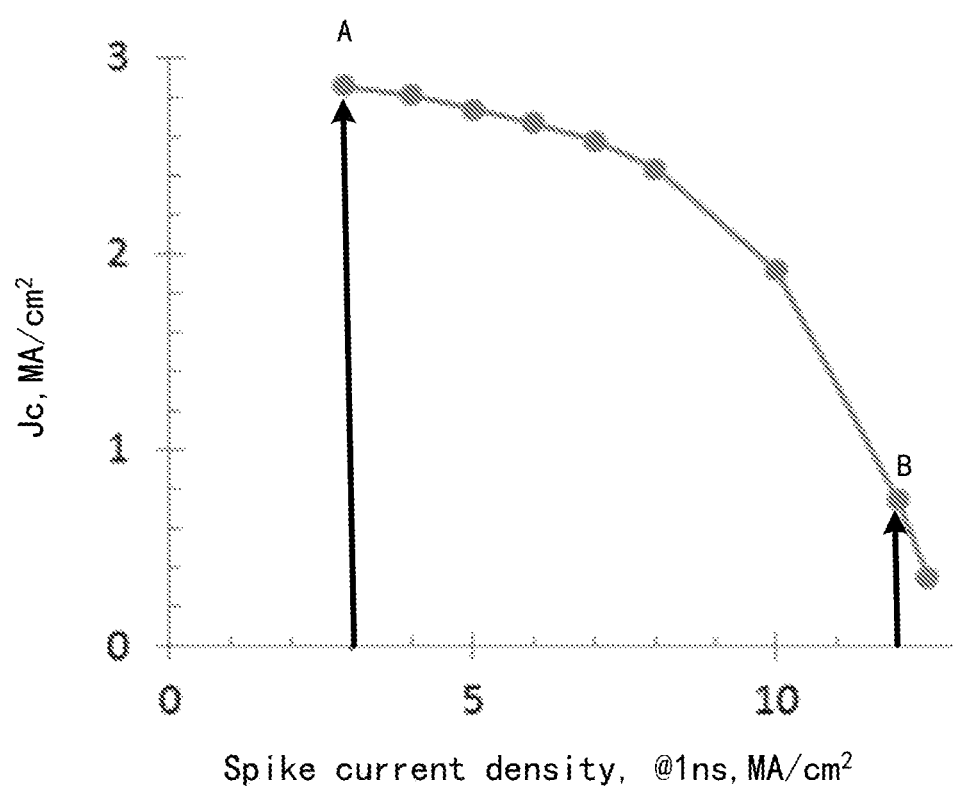
FIG. 4 is a plot showing the simulation of the critical current to switch a bit cell of an STTM device (y axis) as a function of the current spike density (x axis), in accordance with an embodiment.

FIG. 4 shows the simulation of the critical current to switch an MTJ (y axis) as a function of the current spike density (x axis). It can be seen from the comparison between the two points A and B shown in FIG. 4, under the fixed pulse time of the spike current (for example, 1ns), the larger spike current density, the more significant decrease in critical current for switching (Jc) the MTJ can be obtained.

The size of the current spike density depends on the voltage across the bit cell as well as the capacitance of the bit cell to charge it. The voltage is fixed by the supply voltage applied to the bit cell. However, the capacitance of the bit cell can be varied by adding a capacitance in parallel with the bit cell. Adding capacitance will increase the spike current density as the bit cell needs more charge to reach equilibrium. More charge in a very short time means that the MTJ stack 103 is agitated during this initial spike current period, and that allows for switching at lower critical current from the transistor.

Figure 5:
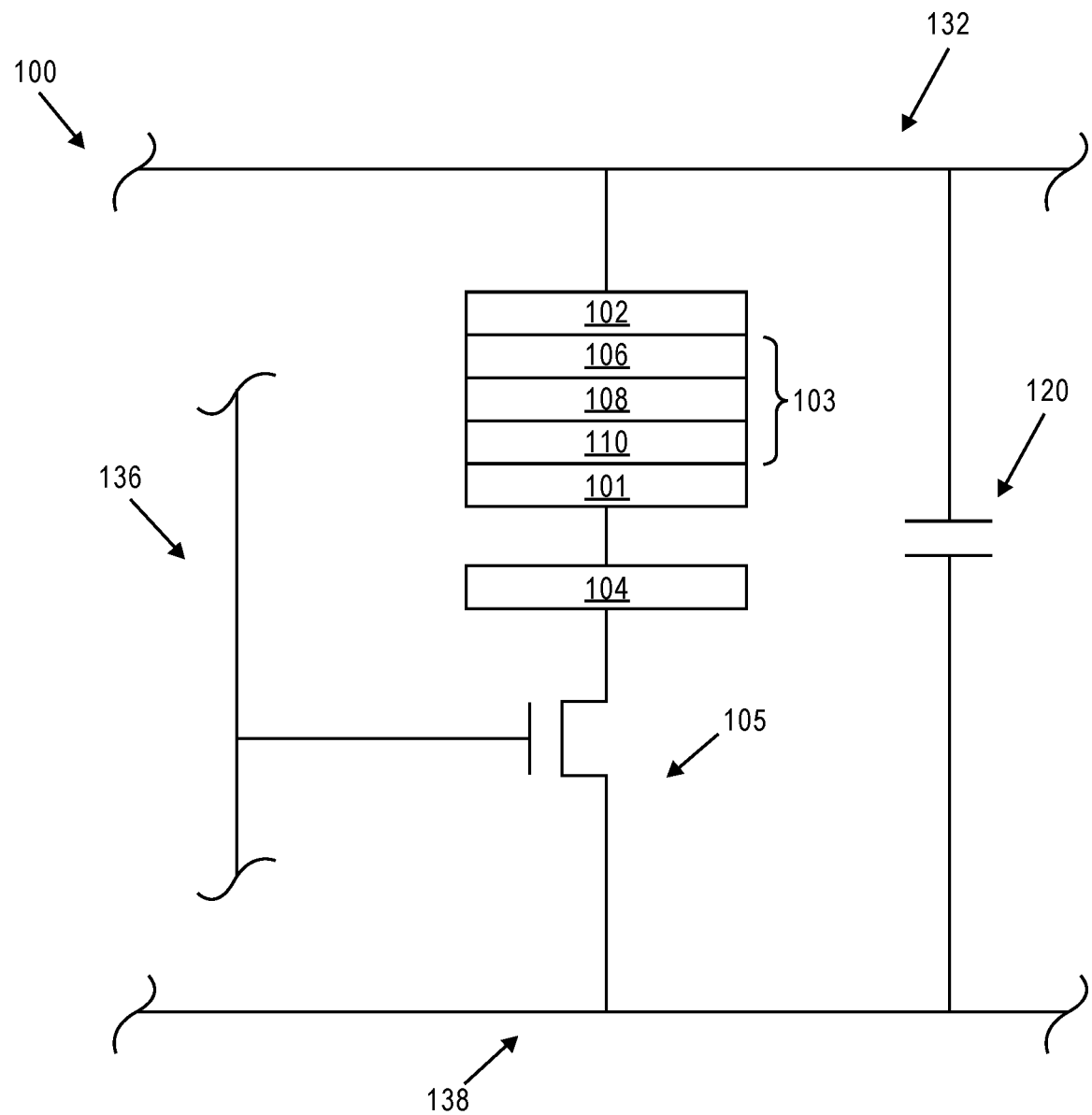
FIG. 5 illustrates a schematic view of a bit cell of an STTM device comprising an Insulator-Metal-Transition (IMT) device and an additional capacitor, in accordance with an embodiment of the present invention.

Thus, in an embodiment shown in FIG. 5, a capacitor 120 may be added to the bit cell 100 in order to provide a larger capacitance of the bit cell 100 in order for the IMT device 104 to generate a larger current spike. As shown in FIG. 5, the capacitor 120 may be electrically connected between the bit line 132 and the source line 138 and electrically connected in parallel with the series connected MTJ stack 103, the IMT device 104 and the transistor 105.

FIG. 6A illustrates the relationship between the critical current 603 to switch an STTM bit cell and the spike current density 602, in accordance with the embodiment shown in FIG. 1. FIG. 6B illustrates the relationship between the critical current 604 to switch an STTM bit cell and the spike current density 602, in accordance with the embodiment shown in FIG. 5. The dotted line 601 running across FIGS. 6A and 6B in the top of the diagram is what happens in a bit cell without an IMT device. In other words, the dotted line 601 shows the critical current required to switch the bit cell in the conventional STTM device without incorporating the IMT device.

As can be seen from FIG. 6A and FIG. 6B, when the IMT device 104 is incorporated into the bit cell 100, since the momentary spike of current resulting from the turn-on of the IMT device 104 is added to the current that the transistor 105 drives through the bit cell, the critical current 603 in FIG. 6A and the critical current in FIG. 6B are both lower than the critical current 601 required for the conventional STTM device. However, as can be seen from the comparison between FIG. 6A and FIG. 6B, adding an additional capacitor 120 to the bit cell circuit will increase the spike current density 602 as the bit cell needs more charge for the bit cell to reach equilibrium. More charge in a very short time allows for switching the bit cell at lower critical current 604 than the critical current 603 required for bit cell without additional capacitor. Suitable types and capacitances for the capacitor 120 will depend on a given application and will be apparent to the skilled in the art in light of this disclosure.

Figure 7A:
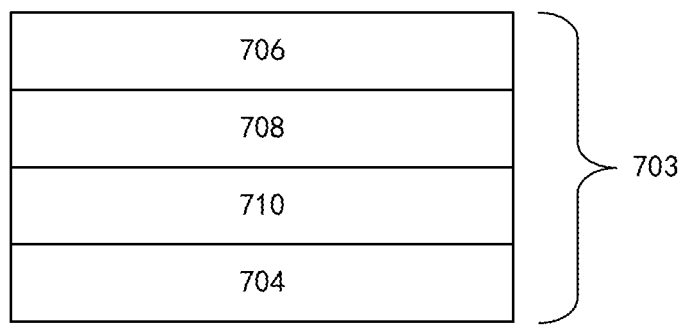
FIG. 7A illustrates a schematic view of a magnetic tunnel junction (MTJ) comprising at least one layer of Insulator-Metal-Transition (IMT) material, in accordance with an embodiment of the present invention.

FIG. 7A illustrates a schematic view of a magnetic tunnel junction (MTJ) 703 comprising at least one layer of Insulator-Metal-Transition (IMT) material, in accordance with an embodiment of the present invention. As can be seen from FIG. 7A, the MTJ 703 is different from the conventional MTJ in that except the fixed magnetic layer 710, the free magnetic layer 706 and the tunneling barrier layer 708 there between, it further comprises at least one layer 704 of IMT material. In other words, in order to achieve the effect of the present invention, an IMT device 104 which is independent from the MTJ 103 as shown in FIG. 1 may be utilized to provide the spike current, or as an alternative, a layer of the IMT material 704 may be integrated into the MTJ 703 as shown in FIG. 7A to achieve the same effect.

Although in FIG. 7A the at least one layer 704 of IMT material is shown below the fixed magnetic layer 710 (or from upside down view, disposed over the fixed magnetic layer 710), the layer 704 may also be disposed over the free magnetic layer 706 (or from upside down view, disposed below the free magnetic layer 706). Further, although in FIG. 7A the layer 704 of IMT material is shown in direct contact with the fixed magnetic layer 710, one or more intermediate layer may be disposed between the layer 704 of IMT material and the fixed magnetic layer 710 (or the free magnetic layer 706).

Figure 7B:
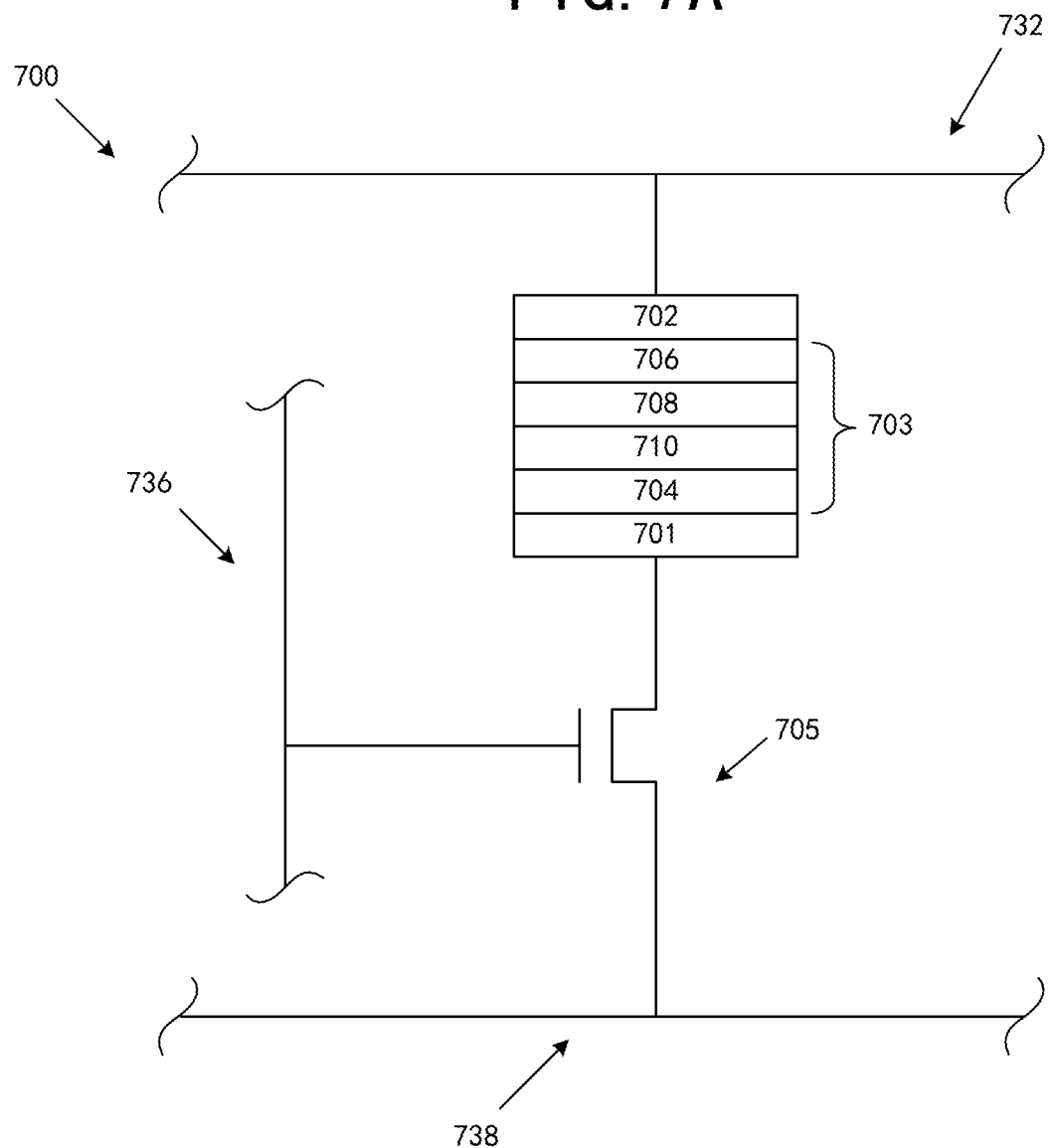
FIG. 7B illustrates a schematic view of a bit cell of an STTM device comprising the MTJ shown in FIG. 7A, in accordance with an embodiment of the present invention.

FIG. 7B illustrates a schematic view of a bit cell 700 of an STTM device comprising the MTJ 703 shown in FIG. 7A, in accordance with an embodiment of the present invention. Similar to the previously described structure in FIG. 1, electrically connected to the MTJ stack 703 are the electrodes 701 and 702. The electrodes 701 and 702 are each of a material or stack of materials operable for electrically contacting magnetic electrodes of a STTM device, and may be any material or stack of materials known in the art for such a purpose. The transistor 705 in the embodiment shown in FIG. 7B is electrically connected to the first electrode 701. The second electrode 702 may be electrically connected to a bit line 732. The bit cell 70 of the STTM device may further include additional read and write circuitry (not shown), a sense amplifier (not shown), a bit line reference (not shown), and the like, as will be understood by those skilled in the art, for the operation of the STTM device.

Furthermore, although not shown, the bit cell 700 in FIG. 7B may also comprise an additional capacitor as that shown in FIG. 5. As mentioned above, adding an additional capacitor to the bit cell circuit will increase the spike current density as the bit cell needs more charge for the bit cell to reach equilibrium. More charge in a very short time allows for switching the bit cell at lower critical current.

Figure 8:
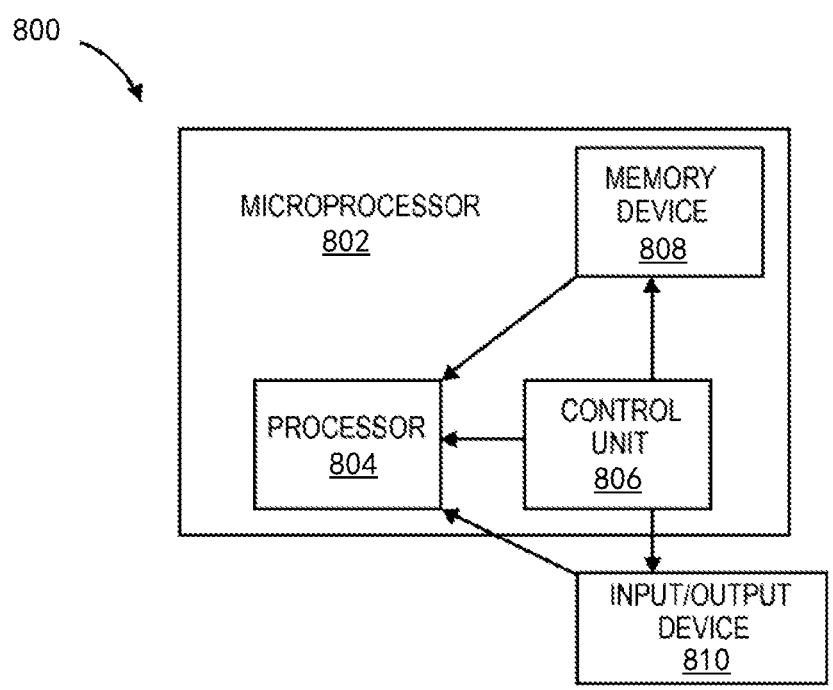
FIG. 8 illustrates a block diagram of an electronic system, in accordance with an embodiment of the present invention.

FIG. 8 illustrates a block diagram of an electronic system 800, in accordance with an embodiment of the present invention. The electronic system 800 can correspond to, for example, a portable system, a computer system, a process control system, or any other system that utilizes a processor and an associated memory. The electronic system 800 may include a microprocessor 802 (having a processor 804 and control unit 806), a memory device 808, and an input/output device 810 (it is to be understood that the electronic system 800 may have a plurality of processors, control units, memory device units and/or input/output devices in various embodiments). In one embodiment, the electronic system 800 has a set of instructions that define operations which are to be performed on data by the processor 804, as well as, other transactions between the processor 804, the memory device 808, and the input/output device 810. The control unit 806 coordinates the operations of the processor 804, the memory device 808 and the input/output device 810 by cycling through a set of operations that cause instructions to be retrieved from the memory device 808 and executed. The memory device 808 can include a spin transfer torque memory device as described in the present description. In an embodiment, the memory device 808 is embedded in the microprocessor 802, as depicted in FIG. 8.

Figure 9:
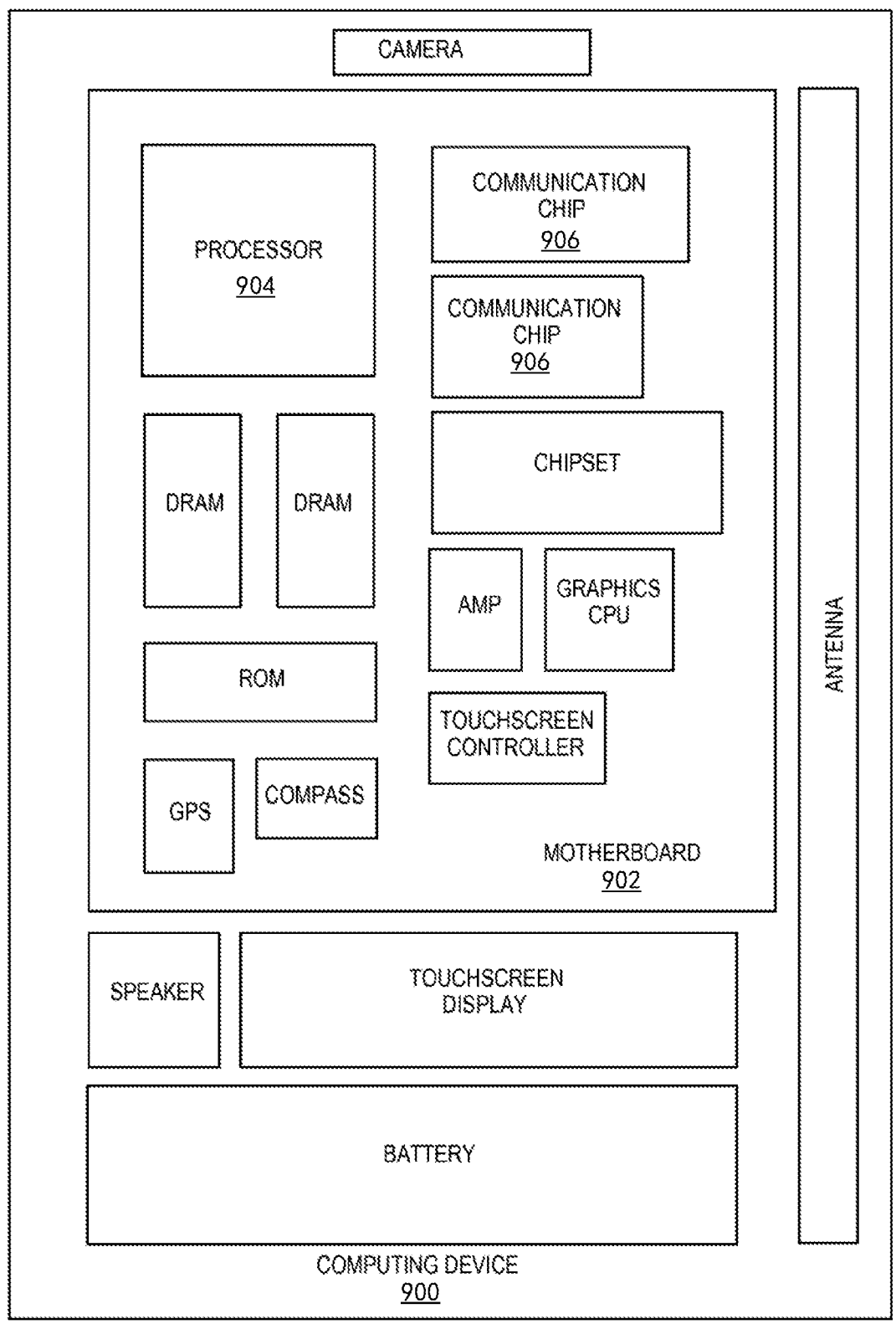
FIG. 9 illustrates a functional block diagram of computing device in accordance with an embodiment of the present invention.

FIG. 9 illustrates a computing device 900 in accordance with one implementation of the invention. The computing device 900 houses a motherboard 902. The motherboard 902 may include a number of components, including but not limited to a processor 904 and at least one communication chip 906. The processor 904 is physically and electrically coupled to the motherboard 902. In some implementations the at least one communication chip 906 is also physically and electrically coupled to the motherboard 902. In further implementations, the communication chip 906 is part of the processor 904.

Depending on its applications, computing device 900 may include other components that may or may not be physically and electrically coupled to the motherboard 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 706 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor includes one or more devices, such as spin transfer torque memory built in accordance with implementations of the present invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip includes one or more devices, such as spin transfer torque memory device built in accordance with implementations of the present invention.

In further implementations, another component housed within the computing device 900 may contain an integrated circuit die that includes one or more devices, such as spin transfer torque memory device built in accordance with implementations of the present invention.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

It is to be understood that the above description is intended to be illustrative, and not restrictive. For example, although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

EXAMPLES

Example Embodiment 1

A spin transfer torque memory (STTM) device comprises a magnetic tunnel junction (MTJ), and a transistor electrically connected to a word line and a source line. The MTJ comprises a fixed magnetic layer, a free magnetic layer, and a tunneling barrier layer between the fixed magnetic layer and the free magnetic layer. The STTM device further comprises an Insulator-Metal-Transition (IMT) device electrically connected in series with the MTJ and the transistor, wherein the IMT device transitions from a high resistance state to a low resistance state when a voltage across it exceeds a threshold voltage.

Example Embodiment 2

The IMT device is electrically connected between the transistor and the MTJ, and the MTJ is electrically connected to a bit line.

Example Embodiment 3

The MTJ is electrically connected between the transistor and the IMT device, and the IMT device is electrically connected to a bit line.

Example Embodiment 4

The IMT device comprises at least one layer of Insulator-Metal-Transition (IMT) material.

Example Embodiment 5

The at least one layer of Insulator-Metal-Transition (IMT) material comprises a material selected from the group consisting of $TiO_2$, $Si_3N_4$, $VO_2$, multicomponent chalcogenide, $NbO_2$, $TaO_X$, Ag and Oxide.

Example Embodiment 6

The IMT device is a schottky diode and comprises $TiO_2$.

Example Embodiment 7

The IMT device is a tunneling diode and comprises $Si_3N_4$.

Example Embodiment 8

The IMT device is a varistor and comprises a multilayer stack of $TaO_X/TiO_2/TaO_X$.

Example Embodiment 9 the IMT device is a compositional IMT device and comprises a multilayer stack of Ag/oxide.

Example Embodiment 10

The IMT device is a Mott IMT device and comprises $VO_2$.

Example Embodiment 11

The IMT device is an Anderson IMT device and comprises multicomponent Chalcogenide.

Example Embodiment 12

The IMT device is a Peierls IMT device and comprises $NbO_2$.

Example Embodiment 13

The STTM device further comprises a capacitor electrically 15 connected between the bit line and the source line and electrically connected in parallel with the series connected MTJ, the IMT device and the transistor.

Example Embodiment 14

The MTJ further comprises a first electrode over which the fixed magnetic layer is located, a second electrode over the free magnetic layer, and an anti-ferromagnetic layer between the fixed magnetic layer and the first electrode.

Example Embodiment 15

The IMT device is electrically connected to one of the first electrode and the second electrode, and the bit line is electrically connected to the other of the first electrode and the second electrode.

Example Embodiment 16

The MTJ further comprises a first electrode over which the fixed magnetic layer is located, a second electrode over the free magnetic layer, and an anti-ferromagnetic layer between the fixed magnetic layer and the first electrode.

Example Embodiment 17

The transistor is electrically connected to one of the first electrode and the second electrode, and the IMT device is electrically connected to the other of the first electrode and the second electrode.

Example Embodiment 18

A magnetic tunnel junction (MTJ) comprises a fixed magnetic layer, a free magnetic layer, a tunneling barrier layer between the fixed magnetic layer and the free magnetic layer, and at least one layer of insulator-Metal-Transition (IMT) material over one of the fixed magnetic layer and the free magnetic layer, wherein the at least one layer of IMT material transitions from a high resistance state to a low resistance state when a voltage across it exceeds a threshold voltage.

Example Embodiment 19

The at least one layer of Insulator-Metal-Transition (IMT) material comprises a material selected from the group consisting of $TiO_2$, $Si_3N_4$, $VO_2$, multicomponent chalcogenide, $NbO_2$, $TaO_X$, Ag and Oxide.

Example Embodiment 20

A spin transfer torque memory (STTM) device comprises a magnetic tunnel junction (MTJ) and a transistor electrically connected to a word line, a source line and connected in series with the MTJ. The MTJ comprises a fixed magnetic layer, a free magnetic layer, a tunneling barrier layer between the fixed magnetic layer and the free magnetic layer, and at least one layer of Insulator-Metal-Transition (IMT) material over one of the fixed magnetic layer and the free magnetic layer, wherein the at least one layer of IMT material transitions from a high resistance state to a low resistance state when a voltage across it exceeds a threshold voltage.

Example Embodiment 21

The at least one layer of Insulator-Metal-Transition (IMT) material comprises a material selected from the group consisting of $TiO_2$, $Si_3N_4$, $VO_2$, multicomponent chalcogenide, $NbO_2$, $TaO_X$, Ag and Oxide.

Example Embodiment 22

The MTJ is electrically connected to a bit line, and the STTM device further comprises a capacitor electrically connected between the bit line and the source line and electrically connected in parallel with the series connected MTJ and the transistor.

Example Embodiment 23

The a computing device includes one of the above-mentioned STTM device.

The invention claimed is:

1. A spin transfer torque memory (STTM) device comprising:
　a magnetic tunnel junction (MTJ) comprising:
　　a fixed magnetic layer;
　　a free magnetic layer; and
　　a tunneling barrier layer between the fixed magnetic layer and the free magnetic layer;
　a transistor electrically connected to a word line and a source line; and
　an Insulator-Metal-Transition (IMT) device electrically connected in series with the MTJ and the transistor, wherein the IMT device transitions from a high resistance state to a low resistance state when a voltage across it exceeds a threshold voltage.

2. The STTM device of claim 1, wherein the IMT device is electrically connected between the transistor and the MTJ, and the MTJ is electrically connected to a bit line.

3. The STTM device of claim 2, further comprising a capacitor electrically connected between the bit line and the source line and electrically connected in parallel with the series connected MTJ, the IMT device and the transistor.

4. The STTM device of claim 2, wherein the MTJ further comprises a first electrode over which the fixed magnetic layer is located, a second electrode over the free magnetic layer, and an anti-ferromagnetic layer between the fixed magnetic layer and the first electrode.

5. The STTM device of claim 4, wherein the IMT device is electrically connected to one of the first electrode and the second electrode, and the bit line is electrically connected to the other of the first electrode and the second electrode.

6. The STTM device of claim 1, wherein the MTJ is electrically connected between the transistor and the IMT device, and the IMT device is electrically connected to a bit line.

7. The STTM device of claim 6, wherein the MTJ further comprises a first electrode over which the fixed magnetic layer is located, a second electrode over the free magnetic layer, and an anti-ferromagnetic layer between the fixed magnetic layer and the first electrode.

8. The STTM device of claim 7, wherein the transistor is electrically connected to one of the first electrode and the second electrode, and the IMT device is electrically connected to the other of the first electrode and the second electrode.

9. The STTM device of claim 1, wherein the IMT device comprises at least one layer of Insulator-Metal-Transition (IMT) material.

10. The STTM device of claim 9, wherein the at least one layer of Insulator-Metal-Transition (IMT) material comprises a material selected from the group consisting of $TiO_2$, $Si_3N_4$, $VO_2$, multicomponent chalcogenide, $NbO_2$, $TaO_X$, Ag and Oxide.

11. The STTM device of claim 9, wherein the IMT device is a schottky diode and comprises $TiO_2$.

12. The STTM device of claim 9, wherein the IMT device is a tunneling diode and comprises $Si_3N_4$.

13. The STTM device of claim 9, wherein the IMT device is a varistor and comprises a multilayer stack of $TaO_X/TiO_2/TaO_X$.

14. The STTM device of claim 9, wherein the IMT device is a compositional IMT device and comprises a multilayer stack of Ag/oxide.

15. The STTM device of claim 9, wherein the IMT device is a Mott IMT device and comprises $VO_2$.

16. The STTM device of claim 9, wherein the IMT device is an Anderson IMT device and comprises multicomponent Chalcogenide.

17. The STTM device of claim 9, wherein the IMT device is a Peierls IMT device and comprises $NbO_2$.

18. A magnetic tunnel junction (MTJ) comprising:
　a fixed magnetic layer;
　a free magnetic layer;
　a tunneling barrier layer between the fixed magnetic layer and the free magnetic layer; and
　at least one layer of Insulator-Metal-Transition (IMT) material over one of the fixed magnetic layer and the free magnetic layer, wherein the at least one layer of IMT material transitions from a high resistance state to a low resistance state when a voltage across it exceeds a threshold voltage.

19. The magnetic tunnel junction (MTJ) of claim 18, wherein the at least one layer of Insulator-Metal-Transition (IMT) material comprises a material selected from the group consisting of $TiO_2$, $Si_3N_4$, $VO_2$, multicomponent chalcogenide, $NbO_2$, $TaO_X$, Ag and Oxide.

20. A spin transfer torque memory (STTM) device comprising:
　a magnetic tunnel junction (MTJ) comprising:
　　a fixed magnetic layer;
　　a free magnetic layer;
　　a tunneling barrier layer between the fixed magnetic layer and the free magnetic layer; and
　　at least one layer of Insulator-Metal-Transition (IMT) material over one of the fixed magnetic layer and the free magnetic layer, wherein the at least one layer of MT material transitions from a high resistance state to a low resistance state when a voltage across it exceeds a threshold voltage; and
　a transistor electrically connected to a word line, a source line and connected in series with the MTJ.

21. The STTM device of claim 20, wherein the at least one layer of Insulator-Metal-Transition (IMT) material comprises a material selected from the group consisting of $TiO_2$, $Si_3N_4$, $VO_2$, multicomponent chalcogenide, $NbO_2$, $TaO_X$, Ag and Oxide.

22. The STTM device of claim 21, wherein the MTJ is electrically connected to a bit line, and the STTM device further comprises a capacitor electrically connected between the bit line and the source line and electrically connected in parallel with the series connected MTJ and the transistor.

* * * * *